United States Patent
Ichiryu et al.

(10) Patent No.: US 6,798,048 B2
(45) Date of Patent: Sep. 28, 2004

(54) 2-METAL LAYER TAB TAPE AND BOTH-SIDED CSP·BGA TAPE

(75) Inventors: Akira Ichiryu, Ageo (JP); Tatsuo Kataoka, Ageo (JP); Hirokazu Kawamura, Ageo (JP); Katsuhiko Hayashi, Ageo (JP); Masahito Ishii, Ageo (JP)

(73) Assignees: Mitsui Mining & Smelting Company, Ltd., Tokyo (JP); Suzuki Co., Ltd., Nagano (JP)

( * ) Notice: Subject to any disclaimer, the term of this patent is extended or adjusted under 35 U.S.C. 154(b) by 44 days.

(21) Appl. No.: 10/129,923

(22) PCT Filed: Sep. 10, 2001

(86) PCT No.: PCT/JP01/07834
§ 371 (c)(1),
(2), (4) Date: May 13, 2002

(87) PCT Pub. No.: WO02/23617
PCT Pub. Date: Mar. 21, 2002

(65) Prior Publication Data
US 2002/0187334 A1 Dec. 12, 2002

(30) Foreign Application Priority Data
Sep. 12, 2000 (JP) ..................... 2000-276051

(51) Int. Cl.[7] ................ H01L 23/52; H01L 23/495; H01L 23/12
(52) U.S. Cl. ............... 257/668; 257/783; 257/797; 257/774; 257/680
(58) Field of Search ............... 257/668, 783, 257/797, 680, 774, 673, 782, 723, 777, 678, 272, 674, 690

(56) References Cited

U.S. PATENT DOCUMENTS

| | | | | |
|---|---|---|---|---|
| 6,166,433 A | * | 12/2000 | Takashima et al. | 257/702 |
| 6,309,915 B1 | * | 10/2001 | Distefano | 438/127 |
| 6,353,259 B1 | * | 3/2002 | Sato et al. | 257/738 |
| 6,472,726 B1 | * | 10/2002 | Hashimoto | 257/668 |
| 6,566,763 B2 | * | 5/2003 | Shiozawa | 257/782 |
| 2002/0006718 A1 | * | 1/2002 | Distefano | 438/617 |

FOREIGN PATENT DOCUMENTS

| | | | |
|---|---|---|---|
| JP | 59-23555 | | 2/1984 |
| JP | 5-13512 | | 1/1993 |
| JP | 7-58159 | | 3/1995 |
| JP | 2000-243791 | * | 9/2000 |

* cited by examiner

Primary Examiner—Alexander Oscar Williams
(74) Attorney, Agent, or Firm—Young & Thompson

(57) ABSTRACT

A 2-metal layer TAB and a both-sided CSP.BGA tape having an insulating substrate and a wiring layer provided on at least both sides of the substrate, the substrate having evenly spaced sprocket holes on both width direction edges in the longitudinal direction thereof and also having through-holes formed with a punching press, and the through-holes being filled with a conductor by means of a punching press such that the conductor and the wiring layers are electrically connected, which is characterized by having round pilot holes between the sprocket holes formed in the longitudinal direction thereof; and a process of producing the same.

14 Claims, 3 Drawing Sheets

2-METAL LAYER TAB TAPE AND BOTH-SIDED CSP•BGA TAPE

TECHNICAL FIELD

This invention relates to a 2-metal layer TAB tape and a both-sided CSP.BGA tape, and a process of producing them.

1. Background Art

Various types of wiring boards having a conductor layer on both sides thereof are in use. Such wiring boards include those using a flexible substrate, e.g., polyimide, such as a TAB (tape automated bonding) tape, a CSP (chip size package), a BGA (ball grid array), and an FPC (flexible printed circuit); and so-called multilayer printed wiring boards using a rigid substrate, e.g., a glass epoxy laminate.

A substrate having a conductor layer on both sides thereof is produced by making sprocket holes along the both width direction edges of a substrate in the longitudinal direction at regular pitches by a punching press. Sometimes through-holes, etc. are also made by this punching press.

Thereafter a wiring layer is formed on both sides of the substrate by etching and the like. Through-holes are then made in the substrate by means of a punching machine. The through-holes are filled with a conductor by a punching (implanting) process, followed by forming a finish plating layer.

In forming the wiring layer by an etching process, the tape is transported by employing the sprocket holes. The sprocket holes are also available as the pilot holes for registration in filling the through-holes with a conductor (implanting process).

However, there are some cases that slight deformation of the sprocket holes takes place during a wiring layer formation process. By using the deformed sprocket holes as the registration hole for the implanting process, the registration accuracy becomes worse. Further, since the sprocket holes are rectangular, a slight shift occurs when the deformed sprocket holes are used as pilot holes, which also results in that the registration accuracy becomes worse in the implanting process. The inaccuracy of registration has given rise to the fluctuation of the properties of products by lot-by-lot manufacturing when they are transferred to a mass production stage.

2. Disclosure of the Invention

Accordingly, an object of the present invention is to provide 2-metal layer TAB and both-sided CSP.BGA tapes and to provide a process of producing the tapes which do not have any fluctuation of the properties of products, even when they are produced in a mass production system.

As a result of investigation, the present inventors have found that the above object is accomplished by making round holes between sprocket holes which are used as pilot holes in filling through-holes with a conductor by means of a punching press.

The present invention has been completed based on the above finding. The present invention provides a 2-metal layer TAB or both-sided CSP.BGA tape having an insulating substrate and a wiring layer provided on at least both sides of the substrate, the substrate having evenly spaced sprocket holes on both width direction edges in the longitudinal direction thereof and also having through-holes formed with a punching press, and the through-holes being filled with a conductor by means of a punching press such that the conductor and the wiring layers are electrically connected, which is characterized by having round pilot holes between the sprocket holes formed in the longitudinal direction thereof.

The present invention also provides a process of producing a 2-metal layer TAB or both-sided CSP.BGA tape which comprises forming sprocket holes and round pilot holes along both width direction edges of an insulating substrate in the longitudinal direction thereof alternately and at regular pitches by a punching press, forming a wiring layer or a metal foil on at least both sides of the substrate, forming through-holes with a punching press, and filling the through-holes with a conductor with a punching press to electrically connect the conductor to the wiring layers or the metal foils.

BEST MODE FOR CARRYING OUT THE INVENTION

The embodiments for carrying out the present invention are described below.

Two metal layer TAB and both-sided CSP.BGA tapes and a process of producing them are discussed first. While the present invention is widely applicable to flexible substrates, e.g., polyirnide, such as TAB tapes, CSPs, BGAs and FPCs, and so-called multilayer printed wiring boards using a rigid substrate such as a glass epoxy laminate as stated above, the following chiefly refers to application to TAB tapes, particularly what we call 2-metal layer TAB tapes having a wiring layer on both sides and a process of making them.

Figure 1:
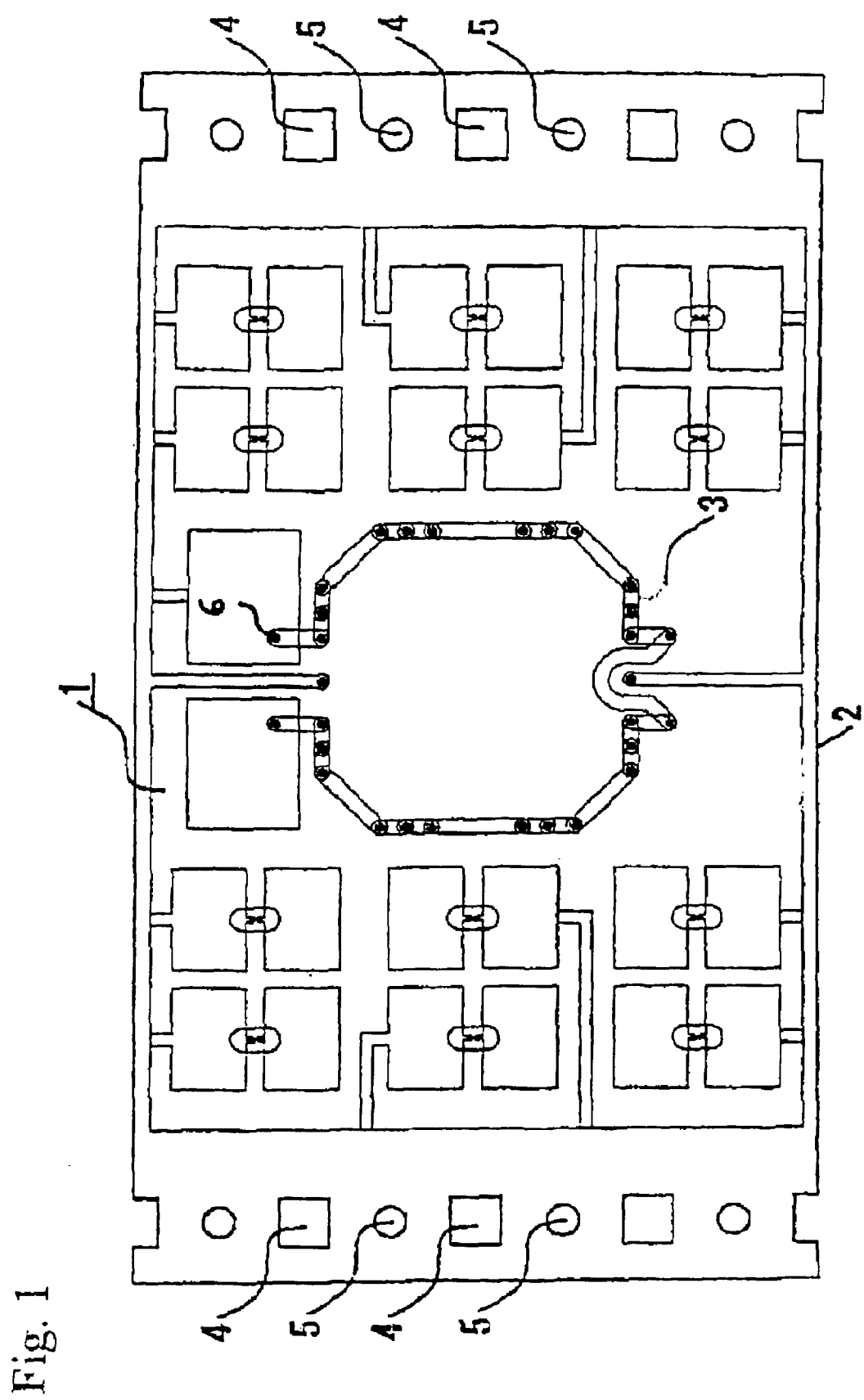
FIG. 1 is a plan view of an example of the 2-metal layer TAB tape according to the present invention.

FIG. 1 is a plan view showing an example of the 2-metal layer TAB tape according to the present invention. In FIG. 1, numeral 1 indicates a 2-metal layer TAB tape; 2, an insulating substrate; 3, a wiring layer (a further wiring layer, not shown, is on the other side of the substrate; 4, sprocket holes; 5, round pilot holes; and 6, through-holes filled with a conductor connected to the wiring layers.

As shown in FIG. 1, the 2-metal layer TAB tape 1 of the present invention has a wiring layer 3 formed on the surfaces of the insulating substrate 2. A polyimide film is usually used as the insulating substrate 2. The wiring layer 3 is formed by, for example, etching a copper foil, etc.

The 2-metal layer TAB tape 1 has evenly spaced sprocket holes 4 along both edges of the width direction thereof in the longitudinal direction thereof. Round pilot holes 5 are made between the sprocket holes 4 made in the longitudinal direction. The sprocket holes 4 and the round pilot holes 5 are formed by the punching press. The sprocket holes 4 have a square shape and are used to carry the tape in forming the wiring layers 3. On the other hand, the round pilot holes 5 are used as a guide for a mold in the implanting process a conductor to form a through-hole conductor layer. The round pilot holes 5 have a diameter of about 1 mm. Not used for tape transportation, the round pilot holes keep their shape without undergoing wear or deformation. Being round-shaped, the pilot holes 5 allow columnar pilot pins to be fitted therein exactly, causing no shift in positioning.

The 2-metal layer TAB tape of the present invention has through-holes formed by means of a punching press, in which a conductor is implanted by means of a punching press to make electrical connections between the conductor and the above-mentioned wiring layers.

Figure 2:
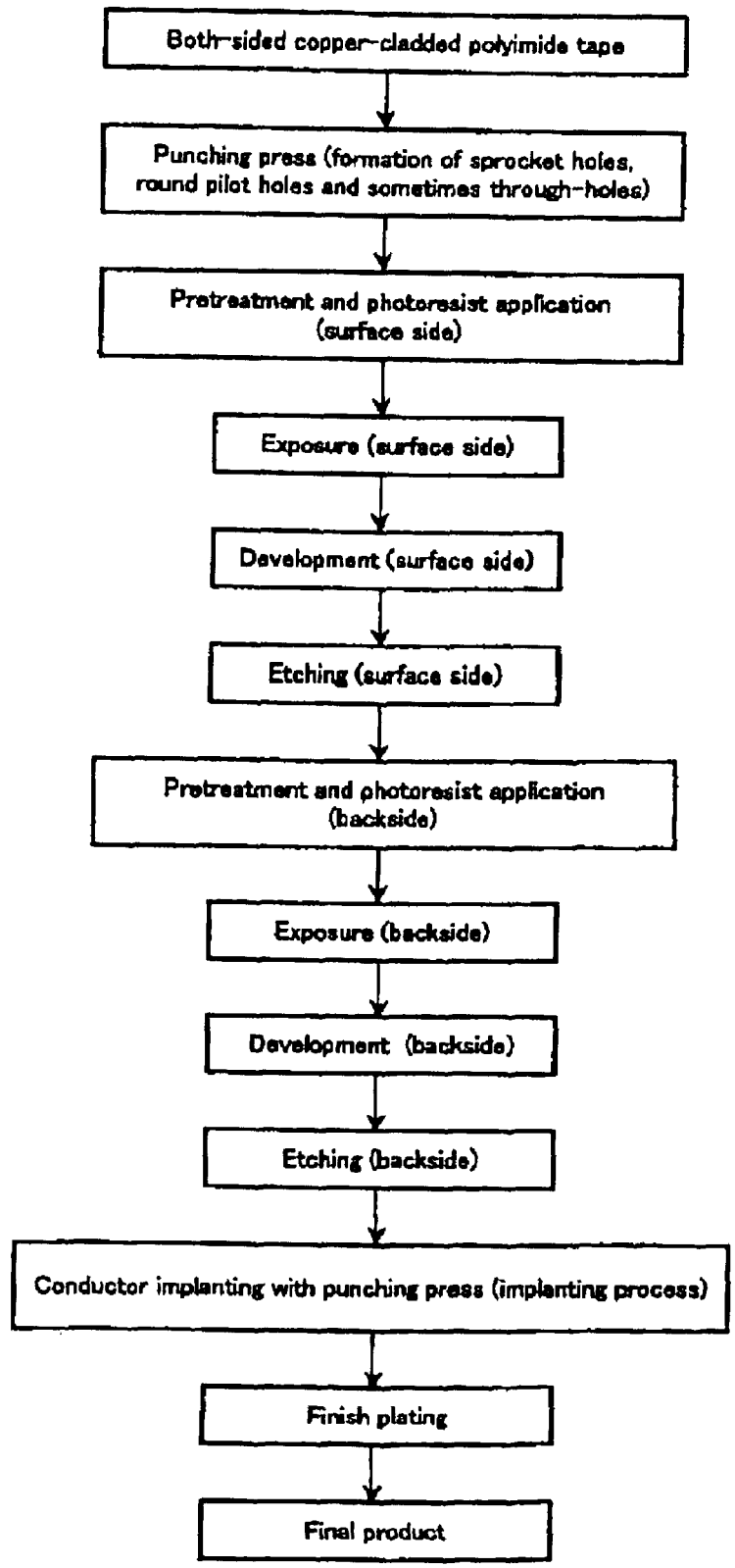
FIG. 2 is a block diagram showing an example of the process of producing the 2-metal layer TAB tape according to the present invention.

The process of producing the 2-metal layer TAB is then described. FIG. 2 is a block diagram showing an example of the process for producing the 2-metal layer TAB tape of the present invention. As shown in FIG. 2, a polyimide tape cladded with copper on both sides is press-punched to form sprocket holes and round pilot holes. Through-holes, etc. are also formed in some cases. The sprocket holes are rectangular while the round pilot holes are circular. The round holes have a diameter of about 1 mm.

After the copper surface is subjected to pretreatment (pickling and degreasing), a photoresist is applied thereto. A wiring layer is formed by exposure, development, and etching. In the same manner, the backside is subjected to pretreatment (pickling and degreasing), a photoresist is applied thereto, and a wiring layer is formed by exposure, development and etching.

When the both-sided laminate substrate having a photoresist thereon is imagewise exposed to ultraviolet light by means of a pattern exposure system, sprocket pins (guide pins) provided on the stage of the pattern exposure system fit into the sprocket holes of the tape to transport the tape. While the tape is transported in this way, the sprocket holes sometimes undergo deformation. The sprocket holes generally have a square shape with a side length of 1.981 mm or 1.42 mm.

Finally, through-holes are made with a punching press, and a conductor is implanted into the through-holes with a punching press to electrically connect the conductor and the wiring layers or the metal foils. Finish plating, such as nickel/gold plating, is conducted to improve reliability of the electrical connections to obtain a final product.

In the present invention, through-holes are formed by the punching press as described above, so that desmearing as in a wet process is not needed. Electrical connections are also achieved by a punching method using an ordinary punching press. That is, a conductor, such as a solder plate or a copper foil, is put on the substrate having press-punched holes and again punched to implant the conductor into the holes. This is an extremely simplified step, which leads to cost reduction.

When a conductor is implanted into the through-holes with a punching press, registration can be effected by fitting pilot pins through the round pilot holes made in the tape. Not used as guide holes for tape transportation in circuit formation, the round pilot holes do not suffer deformation. The pilot holes being round, the pilot pins fit therein neatly.

Since registration in the implanting process is carried out by the use of the round pilot holes which, not used as guide holes for tape transportation, do not suffer deformation and into which round pilot pins fit neatly, registration is accurate. As a result, fluctuation of properties do not occur even in the mass production.

As stated, the present invention is widely applicable to TAB tapes, CSPs, BGAs and FPCs which use a flexible substrate such as polyimide, and so-called multilayer printed wiring boards using a rigid substrate such as a glass epoxy laminate.

The present invention will further be illustrated in greater detail based on Examples.

EXAMPLE 1

A 2-metal layer TAB tape as shown in Table 1 was produced in accordance with the production steps shown in FIG. 2 by using a 35 mm wide polyimide film cladded with copper on both sides (polyimide layer thickness: 50 $\mu$m; copper foil thickness: 18 $\mu$m each; trade name: Espanex, produced by Nippon Steel Chemical Co., Ltd.). In the step of punching press shown in FIG. 2, sprocket holes and round pilot holes were formed alternately and at regular pitches. The sprocket holes were used for tape transportation, and the round pilot holes were used for registration in the implanting process.

As a result the average resistance was 6 m$\Omega$/hole (diameter: 100 $\mu$m) with a standard deviation of 0.3 m$\Omega$/hole.

COMPARATIVE EXAMPLE 1

A 2-metal layer TAB tape was produced in the same manner as in Example 1, except that only sprocket holes were made in the step of punching press shown in FIG. 2 and that the sprocket holes were used for both tape transportation and registration in the implanting process.

As a result of four runs of testing, the average resistance in each run was 6 to 8 m$\Omega$/hole (diameter 100 $\mu$m) with a standard deviation of 1 to 6 m$\Omega$/hole.

Figure 3:
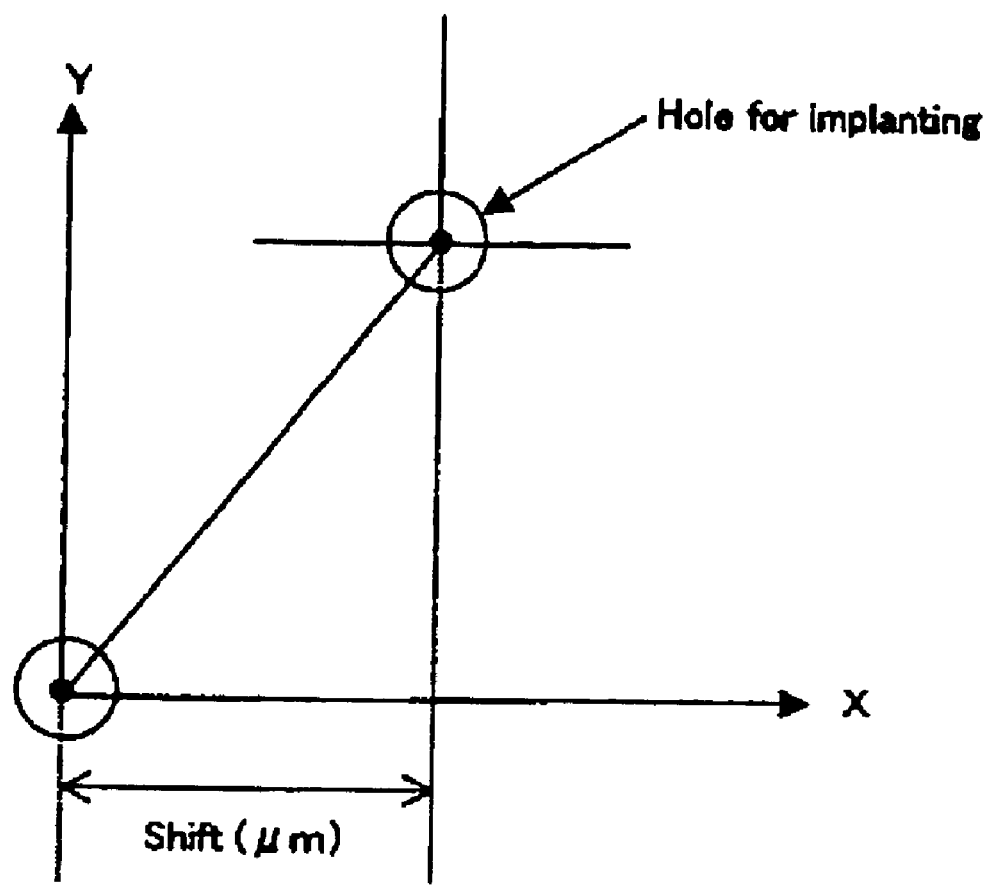
FIG. 3 is an illustration showing the method of measuring a maximum shift of pattern position accuracy in Example 1 and Comparative Example 1.

The maximum shift of pattern position accuracy in terms of a shift of the center of holes was measured according to the method of FIG. 3. In FIG. 3, X is a tape running direction, and Y is a tape width direction. The maximum shift was represented by the distance in X direction. Measurement was made on 7 points. The results obtained are shown in Table 1.

TABLE 1

($\mu$m)

| Hole | Example 1 | Comparative Example 1 |
| --- | --- | --- |
| 1 | 10 | 50 |
| 2 | 5 | 65 |
| 3 | 10 | 55 |
| 4 | 0 | 60 |
| 5 | 5 | 85 |
| 6 | 10 | 75 |
| 7 | 15 | 70 |

As is apparent from the results of Table 1, Example 1 was superior to Comparative Example 1 in pattern position accuracy by about 50 $\mu$m in average.

Industrial Applicability

As described above, the 2-metal layer TAB and both-sided CSP.BGA tapes of the present invention do not show fluctuation of properties even in the mass production. The production process of the present invention provides the 2-metal layer tab and both-sided CPS.BGA tapes easily and conveniently.

What is claimed is:

1. A tape for making a wiring board, comprising:
   an insulating substrate and a wiring layer on at least both sides of the substrate,
   said substrate having evenly spaced sprocket holes on both width direction edges in the longitudinal direction thereof and also having through-holes said through-holes being filled with a conductor such that said conductor and said wiring layers are electrically connected,
   said substrate further having round pilot holes between said sprocket holes in the longitudinal direction thereof, said pilot holes being arranged and positioned to guide a punching press mold into registration with said through-holes for filling said through-holes with said conductor, and said pilot holes being further arranged to receive pilot pins of the punching press mold.

2. The tape according to claim 1, which has three or more layers inclusive of a metal layer.

3. The tape according to claim 1, wherein said conductor is a metal.

4. The tape according to claim 3, wherein said metal is one of lead, tin, copper, silver and an alloy mainly comprising these metals.

5. The tape according to claim 1, which is plated with nickel or gold.

6. The tape according to claim 1, wherein said sprocket holes are in respective rows at the edges of said substrate and each of said pilot holes is between a respective adjacent pair of said sprocket holes and within the respective one of the rows.

7. The tape according to claim 6, wherein said rows have respective longitudinal axes parallel to each other and wherein centers of said sprocket holes and said pilot holes are on the respective one of said longitudinal axes.

8. The tape according to claim 1, wherein said pilot holes have a diameter of about 1 mm.

9. A tape for making a wiring board, comprising:

an insulating substrate having a wiring layer thereon that is connected to a conductor in a through-hole in said substrate;

plural polygon sprocket holes through said substrate, said sprocket holes being spaced apart in respective longitudinal rows adjacent to longitudinal edges of said substrate; and plural round pilot holes through said substrate, said pilot holes being longitudinally aligned within at least one of said rows and between respective adjacent pairs of said sprocket holes in said at least one row.

10. The tape of claim 9, wherein said pilot holes have a diameter of about 1 mm.

11. The tape of claim 10, wherein said sprocket holes are square and 1–2 mm on a side.

12. The tape of claim 9, wherein a maximum lateral extent of said pilot holes does not exceed a maximum lateral extent of said sprocket holes in said at least one row.

13. The tape of claim 9, wherein said at least one row has a longitudinal axis and centers of said sprocket holes and said pilot holes in said at least one row are on said longitudinal axis.

14. The tape of claim 9, wherein said pilot holes are longitudinally aligned within two of said rows and between respective pairs of said sprocket holes in said two rows.

* * * * *